(12) United States Patent
Uchiyama (10) Patent No.: US 6,583,834 B1
(45) Date of Patent: *Jun. 24, 2003

(54) ADHESIVE, LIQUID CRYSTAL DEVICE, PROCESS FOR MANUFACTURING LIQUID CRYSTAL DEVICE, AND ELECTRONIC EQUIPMENT

(75) Inventor: Kenji Uchiyama, Nagano-ken (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/171,926

(22) PCT Filed: Feb. 16, 1998

(86) PCT No.: PCT/JP98/00647

§ 371 (c)(1),
(2), (4) Date: Oct. 27, 1998

(87) PCT Pub. No.: WO98/38261

PCT Pub. Date: Sep. 3, 1998

(30) Foreign Application Priority Data

Feb. 27, 1997  (JP) ................................................ 9/44386

(51) Int. Cl.⁷ ...................... G02F 1/1333; G02F 1/1345

(52) U.S. Cl. ........................................ 349/122; 349/149

(58) Field of Search ................................. 349/122, 149, 349/152

(56) References Cited

U.S. PATENT DOCUMENTS 5,644,373 A     7/1997 Furushima et al. ......... 349/158
6,042,894 A  *  3/2000 Goto et al. .................. 427/504

FOREIGN PATENT DOCUMENTS

JP          07-197001    *  8/1995
JP          8279371         10/1996
JP          8316625         11/1996
JP          9161543          6/1997

* cited by examiner

*Primary Examiner*—Robert H. Kim
*Assistant Examiner*—Dung Nguyen
(74) *Attorney, Agent, or Firm*—Harness, Dickey & Pierce, P.L.C.

(57) ABSTRACT

In order to provide an adhesive which can enhance adhesiveness on each of adherends even when it is bonded with two adherends composed of different materials, an insulating adhesive material of an adhesive 1 placed between the two adherends is composed of a two-layer structure of a first insulating adhesive material 4 adhered with one adherend, and a second insulating adhesive material 5 adhered with the other adherend. Each of the adhesives 4 and 5 is caused to have proper adhesive properties suitable for the adherend to be bonded with by, for example, adding different kinds of coupling agents. By this construction, the adhesion forces of the adhesives 4 and 5 on each adherend can respectively be enhanced, and the adhesion forces of the anisotropically electrically conductive adhesive can be improved as compared with adhesive comprising a conventional single insulating adhesive material.

17 Claims, 7 Drawing Sheets

Fig. 7 ical field

The present invention relates to an adhesive, and more particularly, to an anisotropic conductive adhesive comprising electrically conductive particles. In addition, it relates to a liquid crystal device using the anisotropic conductive adhesive for connection between a liquid crystal panel and an external circuit substrate or a semiconductor element, and to a process for manufacturing the same. Further, it relates to electronic equipment composed of the aforementioned liquid crystal device as a display part.

BACKGROUND ART

For connection between fine pitch terminals, such as the connection between an input terminal held on a glass substrate of a liquid crystal panel and a terminal of a TCP (Tape Carrier Package) (a bump is sometimes formed on the terminal), anisotropic conductive adhesives are used.

Conventional anisotropic conductive adhesives are composed of a thermosetting or thermoplastic insulating adhesive material such as an epoxy resin, and plural electrically conductive particles disposed in the adhesives. Since such an insulating adhesive material adheres to both adherends, i.e., the glass substrate and the TCP formed of polyimide, a versatile adhesive is employed in order to adhere to any of these adherends including those made of different materials with a given adhesiveness.

Although such a versatile adhesive can adhere to adherends formed of various materials with adhesiveness of a constant level, when the adhesiveness to one adherend is increased to a given level or higher, the adhesiveness to the other adherend decreases, and, as a result, adhesiveness of a constant level as a whole can not be obtained.

In particular, when a glass substrate is used for a liquid crystal panel and is connected to a polymer substrate as an external circuit substrate, they both may have markedly different adhesive properties. Therefore, failures caused by peeling of the adhesive tend to occur in only one of the glass substrate or the polymer substrate.

It is an object of the present invention to provide an anisotropic conductive adhesive which can enhance adhesiveness to each of the adherends even when it is applied to two kinds of adherends composed of different materials, and a liquid crystal device which is safe from connection failures, and a process for manufacturing the liquid crystal device.

SUMMARY OF THE INVENTION

The adhesive of the present invention is an adhesive for adhering a first adherend and a second adherend composed of a different material from that of the first adherend, wherein the adhesive has a first adhesive layer having adhesive properties suitable for the first adherend and a second adhesive layer having adhesive properties suitable for the second adherend.

For adhesion between the first adherend and the second adherend using the adhesive of the present invention, the first adhesive layer can be in contact with the first adhered, and the second adhesive layer can be in contact with the second adherend. This achieves adhesion of one adherend to the other with appropriate adhesion properties suitable for each of the adherends, and thereby enhances strong adhesion between the adherends.

In another aspect, the invention provides the aforementioned adhesive, wherein the first adhesive layer comprises a first insulating adhesive material and a plurality of electrically conductive particles, and the second adhesive layer comprises a second insulating adhesive material.

When electrical connections are required between the first adherend and the second adherend, electrically conductive particles may be incorporated into the first adhesive layer, as is in the present invention. The electrically conductive particles can also naturally be incorporated into the second adhesive layer. In general, however, when the first and second adherends are electrically connected to each other, the first and second adherends are pressed against each other and thereby adhere together. Therefore, if the electrically conductive particles are only incorporated into the first adhesive layer, electrical connections can be achieved.

Incorporation of the electrically conductive particles only in the first adhesive layer achieves easy control of the number and distribution of the electrically conductive particles and hence provides easy production of an anisotropic conductive adhesive. In this embodiment, since the second adhesive layer should only be used for the adhesion to the second adherend, the thickness of the second adhesive layer can be reduced as compared with that of the first adhesive layer.

The first adherend and the second adherend can also be electrically connected to each other by forming, interposed between the first and second adhesive layers, an electrically conductive layer containing an insulating adhesive material and a plurality of electrically conductive particles.

In this case, since the electrically conductive layer which contains the electrically conductive particles does not directly contact the adherend, selection of its raw material depending on the adherend is not required. Accordingly, even when the adhesive is adhered with any adherend, the adhesive properties of the first and second adhesive layers have only to be determined depending on each of the adherends, and the insulating adhesive material of the electrically conductive layer can be used in common. This embodiment hence enhances manufacturing efficiency and reduces the cost in the manufacture of the anisotropic conductive adhesive having a variety of adhesive properties.

As concrete measures for adjusting the adhesive properties of the first and second adhesive layers, there may be mentioned as follows:

(1) To use different primary ingredients in the insulating adhesive materials between the first adhesive layer and the second adhesive layer respectively;

(2) to add different coupling agents to each of the first adhesive layer and the second adhesive layer; and (3) to use different primary ingredients and different coupling agents between the first adhesive layer and the second adhesive layer.

When the same insulating adhesive material is employed in the first and second adhesive layers, and a first coupling agent suitable for the first adherend is added to the first adhesive layer and a second coupling agent suitable for the second adherend is added to the second adhesive layer, only modification of the species of the coupling agents can alter the properties of the adhesives. Therefore, this embodiment can reduce the species of insulating adhesive materials to be used, enhance the manufacturing efficiency and lower the cost.

The present invention also provides, in another aspect, a liquid crystal device comprising a liquid crystal panel having a pair of substrate, a liquid crystal encapsulated between the substrates and an electrode terminal formed on at least one of the substrates, and a circuit substrate having an electrode terminal formed thereon and connected to the one substrate on which the electrode terminal is formed, wherein the aforementioned one substrate and the circuit substrate are connected by an adhesive comprising a first adhesive layer having adhesive properties suitable for one of the one substrate or the circuit substrate, and a second adhesive layer having adhesive properties suitable for the other.

According to the above-mentioned liquid crystal device of the present invention, a substrate for a liquid crystal panel (principally, a glass substrate) is connected to a circuit substrate (principally, a polymer substrate) by using an adhesive comprising a plurality of adhesive layers each having adhesive properties suitable for each of the substrate. As a result, adhesion forces of both substrates are uniformly enhanced, and hence connection reliability can be improved.

In an additional aspect, the invention provides the liquid crystal device, wherein the electrode terminal formed on the one substrate and the electrode terminal formed on the circuit substrate are different in their thickness, the first adhesive layer contains a first insulating adhesive material and a plurality of electrically conductive particles and is in contact with, one of the one substrate and the circuit substrate, a substrate having a thinner electrode terminal, and the second adhesive layer contains a second insulating adhesive material and is in contact with, one of said one substrate and said circuit substrate, and the other substrate having a thicker electrode terminal.

In general, a liquid crystal panel substrate and an external circuit substrate are connected by contact bonding. In this contact bonding step, an adhesive is extruded by the electrode terminal and then run-off. Imaginably, the volume of adhesive extruded by a thicker electrode terminal is larger than that extruded by a thinner electrode terminal. In order to ensure electrical connections between the liquid crystal panel substrate and the external circuit substrate, run-off or discharge of the electrically conductive particles should preferably be avoided.

According to the present invention, since the first layer containing the electrically conductive particles and the substrate having a thinner electrode terminal formed thereon are permitted to contact each other, run-off of the electrically conductive particles during the contact bonding can be avoided.

Practically and in general, the electrode terminal formed on the liquid crystal panel substrate is a transparent electrically-conductive film (indium tin oxide; ITO) and the electrode terminal formed on the circuit substrate is a metal film. In this instance, it is preferable that the first adhesive layer is caused to contact the liquid crystal panel substrate, and the second adhesive layer is caused to contact the circuit substrate. It is because an ITO film is usually thinner than a metal film.

In a still further aspect, the present invention provides a liquid crystal device comprising a liquid crystal panel and a circuit substrate, the liquid crystal panel having a pair of substrates, a liquid crystal encapsulated between the substrates, an electrode terminal formed on at least one of the substrates, and the circuit substrate having an electrode terminal formed thereon and connected to the one substrate, wherein the aforementioned circuit substrate and one substrate are connected to each other by an adhesive having a first adhesive layer having adhesive properties suitable for one of the one substrate or the circuit substrate, a second adhesive layer having adhesive properties suitable for the other, and an electrically conductive layer interposed between the first adhesive layer and the second adhesive layer, and containing an insulating adhesive material and a plurality of electrically conductive particles.

According to this embodiment of the liquid crystal device of the present invention, to connect the liquid crystal panel substrate (principally, a glass substrate) and the external circuit substrate (principally, a polymer substrate), an adhesive comprising plural adhesive layers each having adhesive properties suitable for each substrate and an external circuit substrate, and an electrically conductive layer interposed between the first adhesive layer and the second adhesive layer and comprising electrically conductive particles is used. As a result, adhesiveness on both substrates is uniformly enhanced, and hence the connection reliability can be improved.

In an additional aspect, the present invention provides a liquid crystal device comprising a pair of substrates, a liquid crystal encapsulated between the substrates and a semiconductor device mounted on at least one of the aforementioned substrates, wherein the semiconductor element and the one substrate are connected by an adhesive comprising a first adhesive layer having adhesive properties suitable for one of the one substrate or the semiconductor element, and a second adhesive layer having adhesive properties suitable for the other of the one substrate or the semiconductor element.

This embodiment according to the present invention enhances and firms up the connection between a liquid crystal panel substrate and a semiconductor element in a liquid crystal device obtained by the so-called COG (Chip on Glass) method where the semiconductor element is directly mounted on the liquid crystal panel substrate.

In yet another aspect, the present invention provides electronic equipment comprising the above-mentioned liquid crystal device as a display part and a case housing the display part.

Examples of the electronic equipment of the present invention include mobile phones, wristwatches, notebook computers and the like. The electronic equipment of the invention, in which the adhesive of the present invention is used for adhering a liquid crystal device and an external circuit or a semiconductor element, enhances the adhesion force between the liquid crystal panel and the external circuit or the semiconductor element, reduces the level of defect, and thereby reduces the manufacturing cost.

The present invention provides, in a still further aspect, a process for manufacturing a liquid crystal device by adhering a liquid crystal panel and a circuit substrate by an adhesive, the liquid crystal panel composed of a pair of substrates, a liquid crystal encapsulated between the substrates, and a first electrode terminal formed on at least one of the substrates, the circuit substrate having a second electrode terminal formed thereon and connected to the above-mentioned one substrate, wherein the process comprises the steps of placing an adhesive to between the one substrate and the circuit substrate, the adhesive composed of a first adhesive layer having adhesive properties suitable for one of the one substrate or the circuit substrate and a second adhesive layer having adhesive properties suitable for the other, and connecting the one substrate and the circuit substrate by contact bonding.

According to the process for manufacturing a liquid crystal device of the present invention, a liquid crystal panel substrate (principally, a glass substrate) is connected to an external circuit substrate (principally, a polymer substrate) by using an adhesive comprising a plurality of adhesive layers each having adhesive properties suitable for each of the substrates. Therefore, the adhesiveness of both substrates can be uniformly enhanced.

In another aspect, the invention provides the aforementioned manufacturing process, wherein the first adhesive layer comprises a first insulating adhesive material and a plurality of electrically conductive particles, and the second adhesive layer comprises a second insulating adhesive material.

In addition and advantageously, the present invention provides a process for manufacturing a liquid crystal device comprising a liquid crystal panel having a pair of substrates and a liquid crystal encapsulated between the substrates, and a semiconductor element mounted on at least one of the substrates, wherein the process comprises the steps of placing an adhesive between the one substrate and the semiconductor element, the adhesive composed of a first adhesive layer having adhesive properties suitable for one of the one substrate or the semiconductor element, and a second adhesive layer having adhesive properties suitable for the other, and connecting the one substrate and the semiconductor element by contact bonding.

This embodiment can enhance and firm-up the connection between a liquid crystal panel substrate and a semiconductor element in a liquid crystal device obtained by the so-called COG (Chip on Glass) method, where the semiconductor element is directly mounted on the liquid crystal panel substrate.

BEST MODE FOR CARRYING OUT THE INVENTION

The present invention will now be described in further detail with reference to the embodiments illustrated in the drawings.

(First Embodiment)

Figure 1:
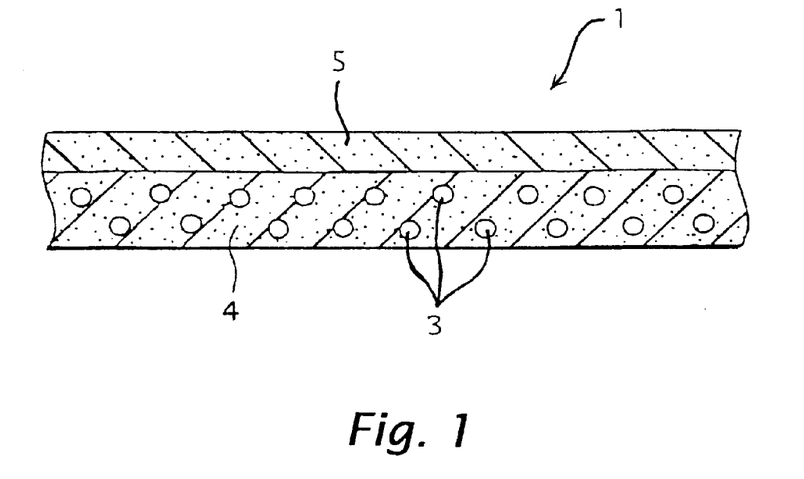
FIG. 1 is a cross-sectional view illustrating an adhesive used in a first embodiment of the present invention.

FIG. 1 illustrates an adhesive 1 of the first embodiment according to the present invention. The adhesive 1 is composed of a first adhesive layer 4 in which a plurality of electrically conductive particles 3 are placed, and a second adhesive layer 5 laminated onto the first adhesive layer 4.

The electrically conductive particles 3 may be solder particles, Ni, Au, Ag, Cu, Pb, Sn and other single metal particles, or mixtures of plural metals, alloys, metal plating and other composite metal particles, particles formed by plating plastic particles (polystyrenes, polycarbonates, acrylic resins, divinylbenzene resins) with Ni, Au, Cu, Fe or other single or plural platings, or carbon particles.

In each of the first adhesive layer 4 and the second adhesive layer 5, an insulating adhesive material having a strong adhesion force to an adherend with which each of the adhesive layer 4 or 5 is bonded is used as a primary ingredient.

Figure 2:
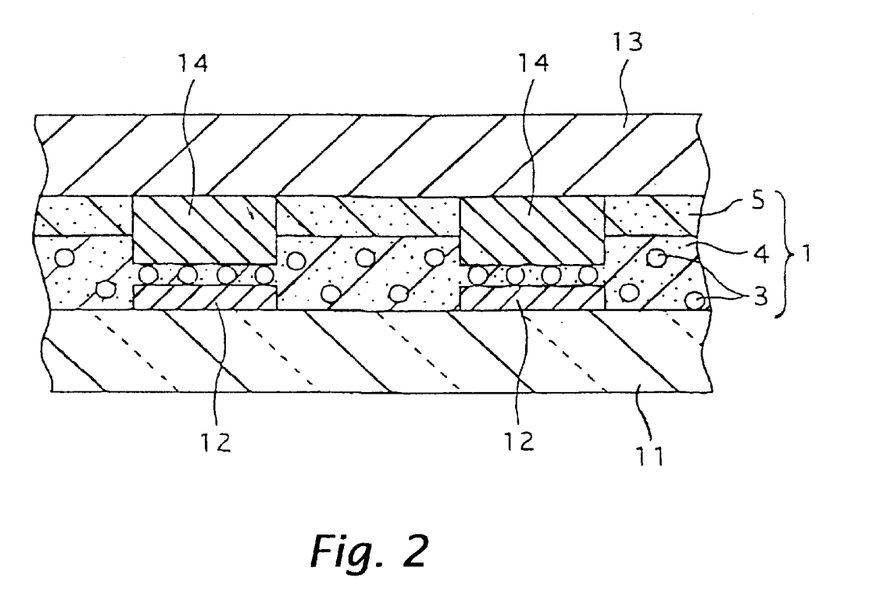
FIG. 2 is a cross-sectional view illustrating a joint area between a liquid crystal panel substrate and a TCP substrate in the first embodiment.

By way of illustration as shown in FIG. 2, when the adhesive 1 is placed between an electrode terminal 12 formed on a glass substrate 11 of a liquid crystal panel and another electrode terminal 14 of TCP 13, the first adhesive layer 4 is composed of, as a primary ingredient, an insulating adhesive material having a high adhesion force to the glass substrate 11 and the terminal 12 formed from, for example, ITO or the like, and the second adhesive layer 5 comprises, as a primary ingredient, another insulating adhesive material having a high adhesion force to TCP 13 formed of polyimide and the electrode terminal 14 obtained by tin-plating on the surface of copper.

Incidentally, when the first adhesive layer 4 is adhered with the glass substrate 11 and the electrode terminal 12, the adhesion area of the glass substrate 11 is larger than that of the electrode terminal 12. Therefore, an insulating adhesive material which exhibits a higher adhesion force on the glass substrate 11 than with the electrode terminal can be employed as the primary ingredient.

By the same token, in the second adhesive layer 5, such an insulating adhesive material can be used as a primary ingredient as to exhibit a higher adhesion force on TCP 13 (formed of polyimide) which will be bonded with the adhesive layers with a larger adhesion area.

Practical examples of the insulating adhesive material used as the primary ingredients in the adhesion layers 4 and 5 include styrene-butadiene-styrene(SBS), epoxide, acrylic, polyester, urethane and other single compounds or mixtures thereof. Although different insulating adhesive materials can be used as the primary ingredients in each of the adhesive layers 4 and 5, the same insulating adhesive material is employed in this embodiment for both adhesive layers, and their adhesive properties are changed or adjusted by adding different coupling agents respectively.

As examples of the coupling agent practically used in the adhesive layer 4, there may be mentioned dimethyldimethoxysilane, γ-aminopropyltriethoxysilane and the like, and any coupling agent having a large number of methoxy groups or ethoxy groups as functional groups can enhance the adhesion strength on the glass.

The coupling agent practically used in the adhesive layer 5 includes, for example, N-β(aminoethyl)γ-aminopropyltrimethoxysilane, γglycidoxypropyltrimethoxysilane and so on. Any coupling agent containing a large number of amino groups and/or epoxy groups as functional groups can improve the adhesion strength on the polyimide.

The adhesive 1 having the construction as mentioned above can be prepared by, for instance, laminating the first adhesive layer 4 composed of the electrically conductive particles 3 onto a base board or a separator for manufacturing, and laminating the second adhesive layer 5 onto the first adhesive layer 4.

The adhesive 1 thus formed is placed between the glass substrate 11 of the liquid crystal panel and TCP 13, as illustrated in FIG. 2. Each of the electrode terminals 12 and 14 is then intruded into the adhesive 1 by, for example, thermocompression bonding, and thus the electrically conductive particles 3 are interposed between the electrode terminal 12 and the electrode terminal 14 to make electrical connections, and thereby the glass substrate 11 and TCP 13 are adhered together by each of the adhesive layers 4 and 5.

Figure 3:
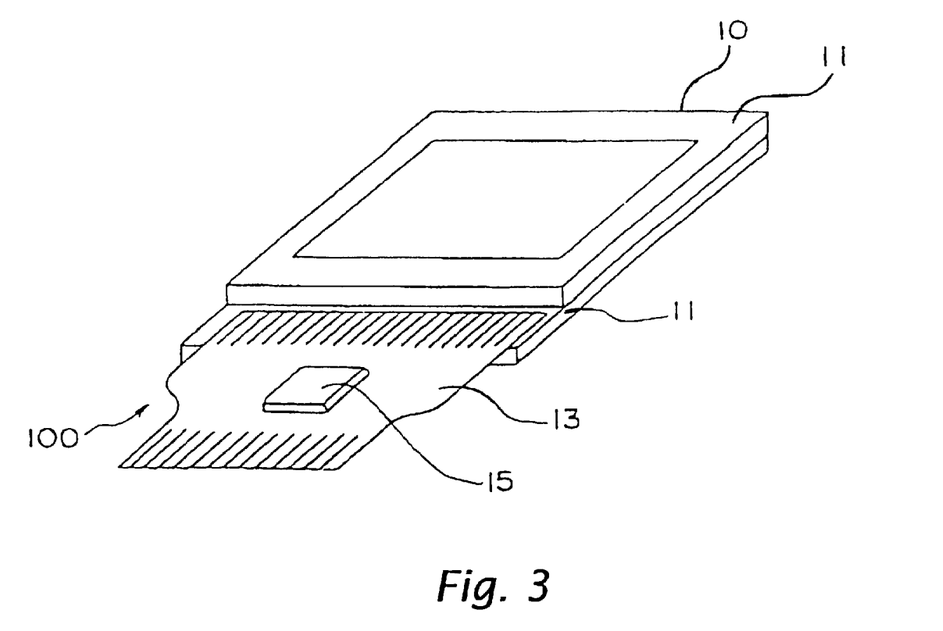
FIG. 3 is an oblique view showing a liquid crystal device according to the present invention.

According to this procedure, as shown in FIG. 3, a liquid crystal device 100 is formed, which is composed of a liquid crystal panel 10 and TCP 13 mounted with a liquid crystal driver IC 15, both of which are adhered together by the adhesive 1.

The liquid crystal device 100 can be utilized as integrated or housed in cases of various electronic equipment. By way of example, it is housed in a case 201 of a mobile phone 200 shown in FIG. 4, or in a case 301 of a notebook computer 300 illustrated in FIG. 5.

The first embodiment of the invention as described above provides the following advantages.

(1) Since the adhesive 1 is formed by laminating two adhesive layers, namely the first and second adhesive layers 4 and 5, the first adhesive layer 4 to be bonded with the glass substrate 11 and the electrode terminal 12 can be composed of an adhesive layer having a high adhesion force on the adherends including the glass substrate 11, and the second adhesive layer 5 to be bonded with TCP 13 and the terminal 14 can be composed of another adhesive layer having a high adhesion force on the adherends including TCP 13. As a result, this construction enhances the adhesion forces with both adherends 11 and 13 and thereby provides the adhesive 1 having excellent adhesive properties, compared to adhesion between the glass substrate 11 and TCP 13 by a conventional single adhesive layer.

(2) Since the electrically conductive particles 3 are incorporated only into the first adhesive layer 4, the number and arrangement or distribution of the electrically conductive particles 3 can easily be controlled, and such an adhesive can readily be produced in comparison with when the electrically conductive particles are incorporated into both the first and second adhesive layers 4 and 5.

(3) As the second adhesive layer 5 contains no electrically conductive particles 3, its thickness can be thinner than that of the first adhesive layer 4, and hence its volume thereby and its cost can be decreased.

(4) The adhesive properties of each of the adhesive layers 4 and 5 are not modified by changing the species of their insulating adhesive materials but by altering the species of the coupling agents added thereto. Therefore, the adhesive properties of each of the adhesive layers 4 and 5 can easily be determined at a low cost.

(Second Embodiment)

Next, the second embodiment of the present invention will now be described in detail with reference to FIGS. 6 and 7. In this embodiment, the same or a similar constructive element to that of the first embodiment is indicated with the same reference numeral with that of the first embodiment, and its explanation is omitted or shortened.

An adhesive 1 (anisotropic conductive adhesive) of the second embodiment is composed of an electrically conductive layer 7 containing a plurality of electrically conductive particles 3, a first adhesive layer 4 laminated below the electrically conductive layer 7, and a second adhesive layer 5 laminated onto the electrically conductive layer 7.

In this embodiment, the electrically conductive layer 7 is formed of an adhesive which can easily be added with the electrically conductive particles 3, and is formed in a comparatively thin layer so as to arrange the electrically conductive particles in line (as a single layer) in the thickness direction (transverse or cross-sectional direction) of layer 7. If the electrically conductive particles are arranged in line, the amount of electrically conductive particles which transfer between the terminals upon adhesion, and hence possibility of terminal short-circuit further decreases.

Each of the first and second adhesive layers 4 and 5 in this embodiment is composed of an adhesive layer having a high adhesive force on an adherend with which each of the adhesive layers 4 and 5 are bonded, as similarly to the aforementioned adhesive layers 4 and 5 in the first embodiment.

Figure 7:
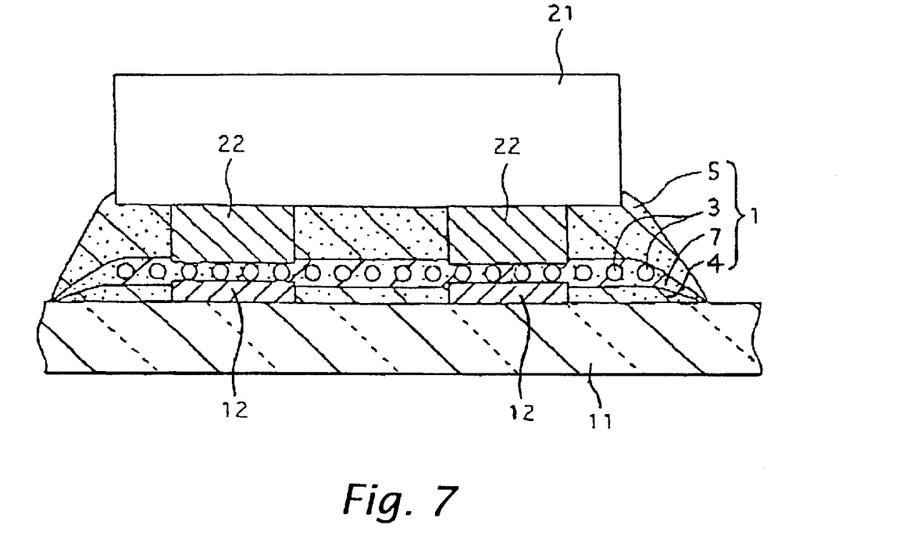
FIG. 7 is a cross-sectional view illustrating a joint area between a liquid crystal panel substrate and a semiconductor element in the second embodiment of the present invention.

By way of illustration, as shown in FIG. 7, when the adhesive 1 is placed and interposed between an electrode terminal 12 formed on a glass substrate 11 of a liquid crystal panel and a terminal (bump) 22 of an IC 21, the first adhesive layer 4 is composed of an adhesive layer having a high adhesion force on the glass substrate 11 and the electrode terminal 12 formed of, for instance, ITO, and the second adhesive layer 5 is composed of another adhesive layer having a high adhesion force on the package of IC 21 formed of ceramic or the like and the terminal 22 being gold-plated.

Also in this embodiment, since the first adhesive layer 4 is in contact in a larger area with the glass substrate 11, an adhesive layer having a higher adhesion force on the glass substrate may be employed. By the same token, as the second adhesive layer 5, an adhesive layer having a higher adhesion force on IC 21 with which the layer makes a larger contact may be employed. The insulating adhesive materials used as a primary ingredient in the adhesive layers 4 and 5 and the electrically conductive layer 7 are similar to those of the first embodiment, and the adhesive properties thereof are altered by adding different coupling agents respectively to each of the layers.

The adhesive 1 having the above-mentioned construction may be prepared by, for example, laminating the first adhesive layer 4 onto a base board or a separator for manufacturing, and then laminating, thereonto, the electrically conductive layer 7 containing the electrically conductive particles 3, and the second adhesive layer 5 in turn.

The thus-constructed adhesive 1 is placed between the glass substrate 11 of the liquid crystal panel and IC 21, as illustrated in FIG. 7. Each of the electrode terminals 12 and 22 is then intruded into the adhesive 1 side by, for instance, thermocompression bonding, and thereby the electrically conductive particles 3 are interposed between the electrode terminal 12 and the electrode terminal 22 to make electrical connections, and the glass substrate 11 and IC 21 are adhered together by each of the adhesive layers 4 and 5. In order to input a signal to IC 21, a flexible substrate is connected to the electrode terminal 12 which is in turn connected to an input terminal of IC 21. To connect the flexible substrate and the electrode terminal 12 formed on the glass substrate, the adhesive described in the first embodiment can preferably be employed.

The second embodiment as thus described can give advantages similar to the aforementioned advantages (1) to (4).

To be more specific, (1) since the adhesive 1 is formed by laminating three layers, that is, the first adhesive layer 4, the second adhesive layer 5 and the electrically conductive layer 7, the first adhesive layer 4 which is adhered with the glass substrate 11 and/or the electrode terminal 12 can be composed of an adhesive layer having a high adhesion force on these adherends including the glass substrate 11, and the second adhesive layer 5 which is adhered with IC 21 and/or the electrode terminal 22 can be composed of an adhesive layer having a high adhesion force on these adherends such as IC 21. Accordingly, the adhesion force on each of the adherends can be enhanced and thereby provides the adhesive 1 having excellent adhesive properties, compared to adhesion between the glass substrate 11 and IC 21 by a conventional adhesive layer.

(2) Since the electrically conductive particles 3 are incorporated only into the electrically conductive layer 7, the number and arrangement or distribution of the electrically conductive particles 3 can easily be adjusted and such an adhesive can readily be produced in comparison with when the electrically conductive particles are incorporated into all of the adhesive layers 4 and 5 and the electrically conductive layer 7.

(3) As the first and second adhesive layers 4 and 5 contain no electrically conductive particles 3, their thickness can be thinner than that of the electrically conductive layer 7, and hence the volume of the insulating adhesive material can be reduced and the cost can be decreased.

(4) The adhesive properties of each of the adhesive layers 4 and 5 are not adjusted by changing the species of their insulating adhesive materials but by altering the species of the coupling agents added thereto. Therefore, the adhesive properties of each of the adhesive layers 4 and 5 can easily be specified at a low cost.

(5) In addition, according to the second embodiment, the electrically conductive layer 7 containing the electrically conductive particles 3 is placed intermediately in the adhesive 1 and is not in direct contact with adherends, there is no requirement to select the material of the electrically conductive layer in harmony with the adherends 11 and 21. Therefore, even when the adhesive 1 is bonded with any adherends, the adhesive properties of the first and second adhesive layers 4 and 5 have only to be determined fitting for each of the adherends, and the electrically conductive layer 7 can be used in common. This embodiment hence enhances manufacturing efficiency and reduces cost in the manufacture of adhesives each having various adhesive properties.

(6) Since the electrically conductive particles 3 are placed in line (as a single layer) along with the thickness direction of the adherend 1, the number of the electrically conductive particles 3 interposed between the electrode terminals 12 and 22 can be controlled easily by adjusting the area of bonded surface of each of the electrode terminals 12 and 22, and by changing the spread number of the electrically conductive particles 3 per unit area. Thus, the number of the electrically conductive particles 3 disposed between the electrode terminals 12 and 22, namely, the properties of electrical connection can be controlled and adjusted with a high precision.

Incidentally, the present invention is not to be limited to the above-mentioned embodiments, and modification and improvement within the range which can achieve the objects of the present invention are also included in the scope of the invention.

To be more specific, in each of the aforementioned embodiments, for example, the electrically conductive particles 3 are incorporated only into the first adhesive layer 4 in the first embodiment or the electrically conductive layer 7 in the second embodiment. Similar advantages in the adhesion strength to those of the first and second embodiments, however, can be obtained by employing any of the following constructions: a construction in which the electrically conductive particles are also contained in the other layer, such as the second adhesive layer 5 in the first or second embodiment or a construction in which the electrically conductive particles are not incorporated into the first adhesive layer 4 in the first embodiment or the electrically conductive layer 7 in the second embodiment but only into the other layer such as the second adhesive layer 5 in the first or second embodiment.

Figure 6:
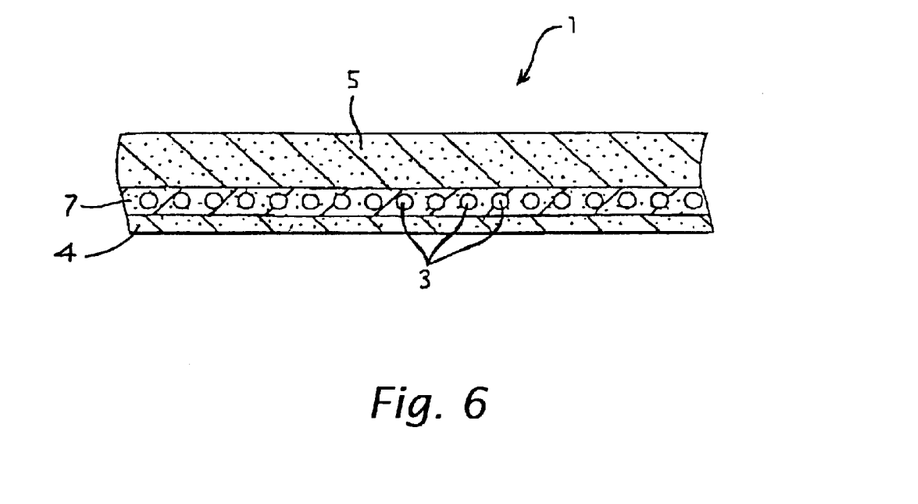
FIG. 6 is a cross-sectional view illustrating an adhesive in a second embodiment of the present invention.

The electrically conductive particles 3 may be placed or arranged uniformly in an adhesive layer comparatively thick as shown in FIG. 1, or placed in one or two lines in the thickness direction in a comparatively thin adhesive layer as illustrated in FIG. 6.

The adhesive 1 can have a laminate structure having four or more layers. In this instance, in addition to adhesives bonded with the glass substrate 11, TCP 13 or IC 21, adhesive layers each bonded with each of the electrode terminals 12, 14 and 22 can be formed respectively. This construction provides the use of adhesive layers each appropriately suitable for the adherends 12, 14 and 22, and hence further enhances the adhesion forces between the adhesives and the adherends.

Further, the adhesive 1 having a three-layer structure in the second embodiment can be used for electrical connections between the electrode terminal 12 of the glass substrate 11 for a liquid crystal panel and the electrode terminal 14 of TCP 13 in the first embodiment. To the contrary, the adhesive 1 having a two-layer structure in the first embodiment can be employed for adhesion between the glass substrate 11 and IC 21 in the second embodiment.

In addition, the adhesive of the present invention can be used not only for adhesion of parts for liquid crystal panels but also for electrical connections between various electrical parts. The adhesive properties of each of the adhesive layers 4 and 5 and the electrically conductive layer 7 can be adjusted by altering the species of the primary ingredient itself of the insulating adhesive material, or by adding other optional additives or the like, as well as by adding coupling agents.

Figure 4:
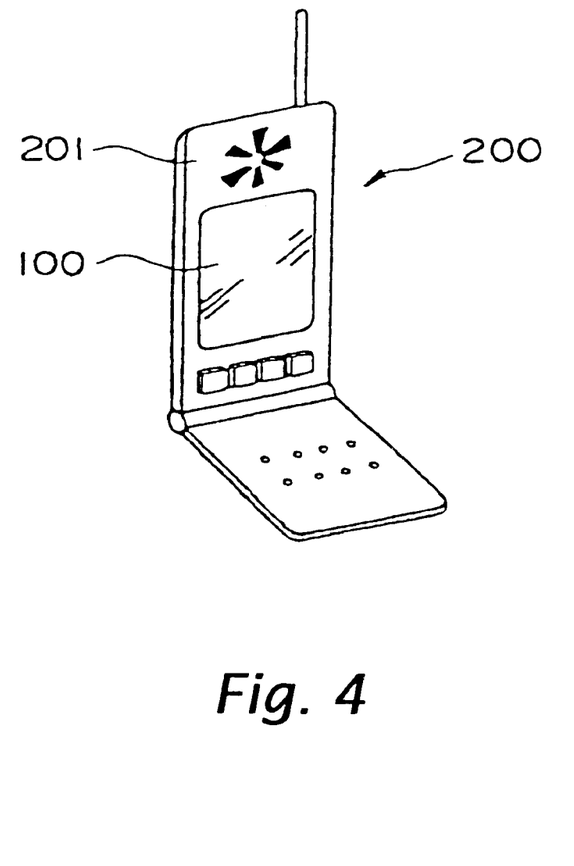
FIG. 4 is an oblique view showing a mobile phone according to the present invention.
Figure 5:
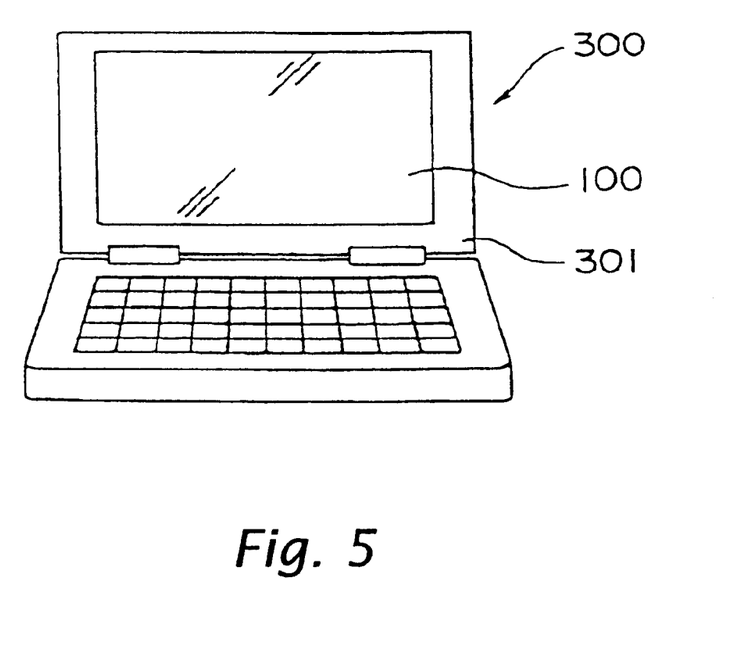
FIG. 5 is an oblique view showing a notebook computer according to the present invention.

In summary, the materials (the species of primary ingredient of the insulating adhesive material or species of the coupling agent to be added), and sizes (thickness of layer or particle size) of the adhesive layers 4 and 5, the electrically conductive layer 7 and the electrically conductive particles 3 of the adhesive 1 can optionally be adjusted according to the species of adherends to be applied to. Therefore, the adhesive 1 of the present invention can also be applied to a variety of electronic equipment without liquid crystal devices, in addition to those which are composed of the liquid crystal device 100 as a display part shown as in the mobile phone 200 or the notebook computer 300.

What is claimed is:

1. An adhesive for adhering a first adherend and a second adherend, said second adherend being different than said first adherend, said adhesive comprising:

a first adhesive layer adapted to be in contact with said first adherend, the first adhesive layer containing a first adhesive material, a first coupling agent, and a plurality of conductive particles; and a second adhesive layer adapted to be in contact with said second adherend, the second adhesive layer containing a second adhesive material and a second coupling agent, wherein said first and second adhesive materials exhibit different adhesive properties, wherein said first coupling agent enables said first adhesive material to have a stronger adhesive force to said first adherend than that of said second adhesive material, and said second coupling agent enables said second adhesive material to have a stronger adhesion force to said second adherend than that of said first adhesive material.

2. The adhesive according to claim 1, wherein said first adhesive material is a first insulating adhesive material, said second adhesive material is a second insulating adhesive material.

3. The adhesive of claim 1, wherein said first adherend has a first terminal on its surface and said first adhesive material has a stronger adhesion force to said first adherend than that of said second adhesive material.

4. The adhesive of claim 1, wherein said second adherend has a second terminal on its surface and second adhesive material has a stronger adhesion force to said second adherend than that of said first adhesive material.

5. An adhesive for adhering a first adherend and a second adherend, said second adherend being different than said first adherend, said adhesive comprising:
   a first adhesive layer adapted to be in contact with said first adherend, said first adhesive layer containing a first adhesive material and a first coupling agent;
   a second adhesive layer adapted to be in contact with said second adherend, said second adhesive layer containing a second adhesive material and a second coupling agent, said second adhesive material exhibiting different adhesive properties from said first adhesive material; and
   a conductive layer interposed between said first adhesive layer and said second adhesive layer, said conductive layer comprising an insulating adhesive material and a plurality of conductive particles,
   wherein said first coupling agent enables said first adhesive material to have a stronger adhesive force to said first adherend than that of said second adhesive material, and said second coupling agent enables said second adhesive material to have a stronger adhesion force to said second adherend than that of said first adhesive material.

6. An adhesive for adhering a first adherend and a second adherend, said second adherend being different than said first adherend, said adhesive comprising:
   a first adhesive layer adapted to be in contact with said first adherend; and
   a second adhesive layer adapted to be in contact with said second adherend,
   wherein said first adhesive layer contains an insulating material as a primary ingredient, a first coupling agent and a plurality of conductive particles;
   said second adhesive layer contains said insulating material as a primary ingredient and a second coupling agent;
   said first coupling agent differing from said second coupling agent;
   said first coupling agent enables said first adhesive material to have a stronger adhesion force to said first adherend than that of said second adhesive material; and
   said second coupling agent enables said second adhesive material to have a stronger adhesion force to said second adherend than that of said first adhesive material.

7. A liquid crystal device comprising:
   a first substrate;
   a second substrate located proximate to said first substrate;
   a liquid crystal encapsulated between said first substrate and said second substrate; and
   a circuit substrate wherein an adhesive connects one of said first substrate or said second substrate to said circuit substrate, said adhesive comprising a first laminated adhesive layer on one side and a second laminated adhesive layer on a side opposite to the side said first laminated adhesive layer is located, said first laminated adhesive layer including a first adhesive material, a first coupling agent, and a plurality of conductive particles, said second laminated adhesive layer containing a second adhesive material and a second coupling agent, said first laminated adhesive material and said second laminated adhesive material exhibiting different adhesive properties,
   wherein said first coupling agent enables said first laminated adhesive material to have a stronger adhesive force to said circuit substrate than that of said second laminated adhesive material, and said second coupling agent enables said second adhesive material to have a stronger adhesion force to said first or second substrate than that of said first laminated adhesive material.

8. The liquid crystal device according to claim 7, further comprising:
   a first electrode terminal formed on either of said first substrate or said second substrate;
   a second electrode terminal formed on said circuit substrate, said circuit substrate having a thickness different from said first substrate, wherein said first laminated adhesive layer includes a plurality of conductive particles and being in contact with either said first electrode terminal or said second electrode terminal, and said second laminated adhesive layer being in contact with the other of said first electrode terminal or said second electrode terminal.

9. The liquid crystal device according to claim 8, wherein said first electrode terminal includes a transparent conductive film, said second electrode terminal includes a metal film, said first laminated adhesive layer contacts said first electrode terminal and said second laminated adhesive layer contacts said second electrode terminal.

10. A liquid crystal device comprising:
    a first substrate;
    a second substrate located proximate to said first substrate;
    a liquid crystal encapsulated between said first substrate and said second substrate; and
    a circuit substrate, wherein an adhesive connects either said first substrate or said second substrate to said circuit substrate, said adhesive including a first adhesive layer, a conductive layer and a second adhesive layer, said conductive layer containing a plurality of conductive particles, laminated onto said first adhesive layer, said second adhesive layer being arranged such that said conductive layer is interposed between said first adhesive layer and said second adhesive layer, the first adhesive layer containing an insulating material and a first coupling agent, the second adhesive layer containing said insulating material and a second coupling agent, the first adhesive material exhibiting different adhesive properties from the second adhesive material,
    wherein said first coupling agent enables said first adhesive material to have a stronger adhesion force to said circuit substrate than that of said second adhesive material; and
    said second coupling agent enables said second adhesive material to have a stronger adhesion force to said first or second substrate than that of said first adhesive material.

11. A liquid crystal device comprising:
    a first substrate;
    a second substrate located proximate to said first substrate;
    a liquid crystal encapsulated between said first substrate and said second substrate; and
    a semiconductor element mounted on either said first substrate or said second substrate, wherein an adhesive connects either said first substrate or said second substrate to said semiconductor element, said adhesive comprising a first laminated adhesive layer on one side of said adhesive and a second laminated adhesive layer on a side opposite to the side said first laminated adhesive layer is located, said first laminated adhesive layer including a first adhesive material, a first coupling agent, and a plurality of conductive particles, the second laminated adhesive layer including a second adhesive material and a second coupling agent, said first laminated adhesive material and said second laminated adhesive material exhibiting different adhesive properties, wherein said first coupling agent enables said first laminated adhesive material to have a stronger adhesive force to said semiconductor element than that of said second laminated adhesive material, and said second coupling agent enables said second adhesive material to have a stronger adhesion force to said first or second substrate than that of said first laminated adhesive material.

12. Electronic equipment comprising:

a case; and a display part housed within said case, said display part including a liquid crystal device which comprises a first substrate and a second substrate, a liquid crystal encapsulated between said first substrate and said second substrate, and a circuit substrate wherein an adhesive connects either said first substrate or said second substrate to said circuit substrate, said adhesive comprising a first laminated adhesive layer and a second laminated adhesive layer, said first laminated adhesive layer including a first adhesive material, a first coupling agent, and a plurality of conductive particles, the second laminated adhesive layer including a second adhesive material and a second coupling agent, said first laminated adhesive material and said second laminated adhesive material exhibiting different adhesive properties, wherein said first coupling agent enables said first laminated adhesive material to have a stronger adhesive force to said circuit substrate than that of said second laminated adhesive material, and said second coupling agent enables second adhesive material to have stronger adhesion force to said first or second substrate than that of said first laminated adhesive material.

13. A process for manufacturing a liquid crystal device, said liquid crystal device having a first substrate, a second substrate and a circuit substrate, said process comprising:

placing an adhesive between either said first substrate or said second substrate and said circuit substrate, said adhesive including a first laminated adhesive layer and a second laminated adhesive layer, said first laminated adhesive layer including a first adhesive material, a first coupling agent, and a plurality of conductive particles, the second laminated adhesive layer including a second adhesive material and a second coupling agent, said second adhesive material exhibiting different adhesive properties than said first adhesive material; and connecting either said first substrate or said second substrate and said circuit substrate by contact bonding, wherein said first coupling agent enables said first laminated adhesive material to have a stronger adhesive force to said circuit substrate than that of said second laminated adhesive material, and said second coupling agent enables said second adhesive material to have stronger adhesion force to said first or second substrate than that of said first laminated adhesive material.

14. The process for manufacturing a liquid crystal device according to claim 13, wherein said first adhesive material is a first insulating adhesive material, and said second adhesive material is a second insulating adhesive material.

15. A process for manufacturing a liquid crystal device, said liquid crystal device having a first substrate, a second substrate and a semiconductor element, said semiconductor element mounted on either said first substrate or said second substrate, said process comprising:

placing an adhesive between either said first substrate or said second substrate and said semiconductor element, said adhesive including a first laminate adhesive layer and a second laminate adhesive layer, said first laminated adhesive layer including a first adhesive material, a first coupling agent, and a plurality of conductive particles, the second laminated adhesive layer including a second adhesive material and a second coupling agent, said second adhesive material exhibiting different adhesive properties than said first adhesive material; and mounting said semiconductor element on either of said first substrate or said second substrate by contact bonding, wherein said first coupling agent enables said first laminated adhesive material to have a stronger adhesive force to said semiconductor element than that of said second laminated adhesive material, and said second coupling agent enables said second adhesive material to have stronger adhesion force to said first or second substrate than that of said first laminated adhesive material.

16. Electronic equipment comprising:

a case; and a display part housed within said case, said display part including a liquid crystal device having a first substrate, a second substrate, a liquid crystal encapsulated between said first substrate and said second substrate, a circuit substrate, and an adhesive connecting either of said first substrate or said second substrate and said circuit substrate, wherein said adhesive includes a first adhesive layer, a conductive layer and a second adhesive layer, said conductive layer containing a plurality of conductive particles and laminated onto said first adhesive layer, said second adhesive layer being arranged such that said conductive layer is interposed between said first adhesive layer and said second adhesive layer, said first adhesive layer including an insulating material and a first coupling agent, the second laminated adhesive layer including said insulating material and a second coupling agent, the first adhesive material exhibiting different adhesive properties than said second adhesive material, wherein said first coupling agent enables said first adhesive material to have a stronger adhesion force to said circuit substrate than that of said second adhesive material; and said second coupling agent enables said second adhesive material to have a stronger adhesion force to said first or second substrate than that of said first adhesive material.

17. Electronic equipment including:

a case; and a display part housed within said case, said display part including a liquid crystal device having a first substrate and a second substrate, a liquid crystal encapsulated between said first substrate and said second substrate, a semiconductor element, and an adhesive connecting either of said first substrate or said second substrate and said semiconductor element, said adhesive comprising a first laminated adhesive layer and a second laminated adhesive layer, said first laminated adhesive layer including a first adhesive material, a first coupling agent, and a plurality of conductive particles, the second laminated adhesive layer including a second adhesive material, and a second coupling agent, said first laminated adhesive material and said second laminated adhesive material exhibiting different adhesive properties, wherein said first coupling agent enables said first laminated adhesive material to have a stronger adhesive force to said semiconductor element than that of said second laminated adhesive material, and said second coupling agent enables said second adhesive material to have a stronger adhesion force to said first or second substrate than that of said first laminated adhesive material.

* * * * *

UNITED STATES PATENT AND TRADEMARK OFFICE
CERTIFICATE OF CORRECTION

PATENT NO.     : 6,583,834 B1
DATED          : June 24, 2003
INVENTOR(S)    : Uchiyama It is certified that error appears in the above-identified patent and that said Letters Patent is hereby corrected as shown below:

Column 7,
Line 5, after "adhesive 1" insert -- which is bonded to the glass substrate 11 --

Signed and Sealed this

Third Day of February, 2004

JON W. DUDAS
*Acting Director of the United States Patent and Trademark Office*